United States Patent
Huang et al.

(10) Patent No.: US 8,733,974 B2
(45) Date of Patent: May 27, 2014

(54) LIGHT EMITTING DIODE MODULE AND LAMP

(75) Inventors: Huan-Hsiang Huang, New Taipei (TW); Chih-Wei Lu, New Taipei (TW)

(73) Assignee: Chicony Power Technology Co., Ltd., New Taipei (TW)

( * ) Notice: Subject to any disclaimer, the term of this patent is extended or adjusted under 35 U.S.C. 154(b) by 276 days.

(21) Appl. No.: 13/444,751

(22) Filed: Apr. 11, 2012

(65) Prior Publication Data

US 2013/0271976 A1    Oct. 17, 2013

(51) Int. Cl.
| | |
|---|---|
| *F21S 2/00* | (2006.01) |
| *F21V 21/00* | (2006.01) |
| *H01R 33/00* | (2006.01) |
| *H01R 33/945* | (2006.01) |

(52) U.S. Cl.
USPC ............. 362/249.02; 362/311.02; 362/249.01

(58) Field of Classification Search
USPC ................ 362/249.01–249.19, 640–659, 265
See application file for complete search history.

(56) References Cited

U.S. PATENT DOCUMENTS

| | | | |
|---|---|---|---|
| 6,502,968 B1* | 1/2003 | Simon ...................... | 362/249.04 |
| 8,376,562 B2* | 2/2013 | Osawa et al. ................. | 362/800 |
| 2004/0120156 A1* | 6/2004 | Ryan .............................. | 362/800 |
| 2010/0026157 A1* | 2/2010 | Tanaka et al. ................... | 313/45 |
| 2010/0046221 A1* | 2/2010 | Posselt et al. ............ | 362/249.02 |

* cited by examiner

*Primary Examiner* — Mariceli Santiago
(74) *Attorney, Agent, or Firm* — Chun-Ming Shih; HDLS IPR Services

(57) ABSTRACT

A light emitting diode module includes a metal substrate, a main circuit, an adapter circuit board, an adapter circuit and a plurality of light emitting diodes, and the main circuit is installed on the metal substrate and includes a plurality of first power points, an adapter circuit installed on the adapter circuit board and including a plurality of second power points, each being electrically coupled to each corresponding first power point, and the light emitting diode is installed on a surface of the metal substrate and electrically coupled to the main circuit. A light emitting diode lamp includes a reflection cover, a light emitting diode module and a plurality of power lines.

10 Claims, 4 Drawing Sheets

LIGHT EMITTING DIODE MODULE AND LAMP

FIELD OF THE INVENTION

The present invention relates to a light emitting diode module and a light emitting diode lamp, in particular to the light emitting diode module and lamp with an adapter circuit board.

BACKGROUND OF THE INVENTION

Heat dissipation is a major issue of light emitting diodes applied in illumination lamps, and aluminum-substrate printed circuits are generally used as a solution to overcome the heat dissipation problem of the light emitting diodes, and thus the aluminum-substrate printed circuits gradually replace the materials of conventional printed circuit boards (such as the FR4 fiberglass boards). However, the application of the aluminum substrates creates another problem. When a power line of the lamps is soldered onto the aluminum substrate, the heat energy provided for the melting and soldering processes will be conducted through the aluminum substrate quickly, thus making the soldering process uneasy. A present solution is to solder a connector onto the aluminum substrate by a surface mount technology (SMT) method, and then insert and connect the power line to the connector. This method incurs an additional cost of the connector, and also forms shadows in the light source since the connector has a larger volume than the light emitting diode.

SUMMARY OF THE INVENTION

Therefore, it is a primary objective of the present invention to provide a light emitting diode module that adopts an adapter circuit board to replace the conventional connector, wherein the adapter circuit board is electrically coupled to a light emitting diode and a power line to reduce costs and simplify the manufacturing process.

To achieve the aforementioned objective, the present invention provides a light emitting diode module comprising a metal substrate, a main circuit, an adapter circuit board, an adapter circuit and a plurality of light emitting diodes. The main circuit is installed on a surface of the metal substrate and includes a plurality of first power points. The adapter circuit board includes an adapter surface and a backside opposite to the adapter surface. The adapter circuit is installed on the adapter surface of the adapter circuit board and includes a plurality of second power points with the same quantity of the first power points, and each second power point is attached and electrically coupled to one of the corresponding first power points. The plurality of light emitting diodes is installed on a surface of the metal substrate and electrically coupled to the main circuit.

Preferably, the light emitting diode module further comprises a first fixed soldering point disposed on the surface of the metal substrate and a second fixed soldering point disposed on the surface of the adapter circuit board and corresponding to the first fixed soldering point, and the first fixed soldering point and the second fixed soldering point are soldered and fixed.

Preferably, the light emitting diode module further comprises two first power points, and the two first power points and the first fixed soldering point are arranged into a triangular shape.

Another objective of the present invention is to provide a light emitting diode lamp that replaces the conventional connector by an adapter circuit board, and the adapter circuit board is electrically coupled to the light emitting diode and the power line to reduce the cost and simplify the manufacturing process.

To achieve the aforementioned objective, the present invention provides a light emitting diode lamp comprising a reflection cover, a light emitting diode module and a plurality of power lines.

The reflection cover includes a wire hole. The light emitting diode module is installed on an inner side of the reflection cover and includes a metal substrate, a main circuit, an adapter circuit board and a plurality of light emitting diodes. The metal substrate includes a soldering opening, and the main circuit is installed on the surface of the metal substrate and includes a plurality of first power points, and the adapter circuit board includes an adapter surface and a backside opposite to the adapter surface, and the adapter circuit is installed on the adapter surface of the adapter circuit board, and the adapter circuit includes a plurality of second power points with the same quantity of the first power points, and each second power point is electrically coupled to one of the corresponding first power points, and the light emitting diodes is installed on the surface of the metal substrate and electrically coupled to the main circuit. The plurality of power lines passes from an outer side of the reflection cover through the wire hole and the soldering opening to electrically couple the adapter circuit.

Preferably, the light emitting diode lamp further comprises a first fixed soldering point disposed on the surface of the metal substrate and a second fixed soldering point disposed on the surface of the adapter circuit board and corresponding to the first fixed soldering point, and the first fixed soldering point and the second fixed soldering point are soldered and fixed.

Preferably, the light emitting diode module of the light emitting diode lamp includes two of the first power points, and the two first power points and the first fixed soldering point are arranged into a triangular shape.

Preferably, the adapter circuit board includes a plurality of penetrating holes corresponding to the power lines respectively, and an adapter electrode is formed at an external periphery of each of the penetrating holes, disposed on the backside, and electrically coupled to the adapter circuit, and each of the power lines passes into the penetrating hole and is soldered to each of the adapter electrodes and electrically coupled to the adapter circuit.

Preferably, each power line includes an inverted-hook connector passing into the corresponding penetrating hole to fix the power line at the penetrating hole and keep the inverted-hook in contact with the adapter electrode.

Preferably, the backside includes a light reflecting layer disposed thereon, and the light reflecting layer is in a white color.

Preferably, the soldering opening is disposed at the center of the metal substrate.

Compared with the prior art, the present invention replaces the connector by the adapter circuit board to reduce the component cost and the soldering manufacturing cost, and the adapter circuit board has a thickness substantially equal to or smaller than the thickness of the light emitting diode, so that shadows will not be formed in the light source of the light emitting diode.

DESCRIPTION OF THE PREFERRED EMBODIMENTS

The technical characteristics and contents of the present invention will become apparent with the following detailed description and related drawings. The drawings are provided for the purpose of illustrating the present invention only, but not intended for limiting the scope of the invention.

Figure 1:
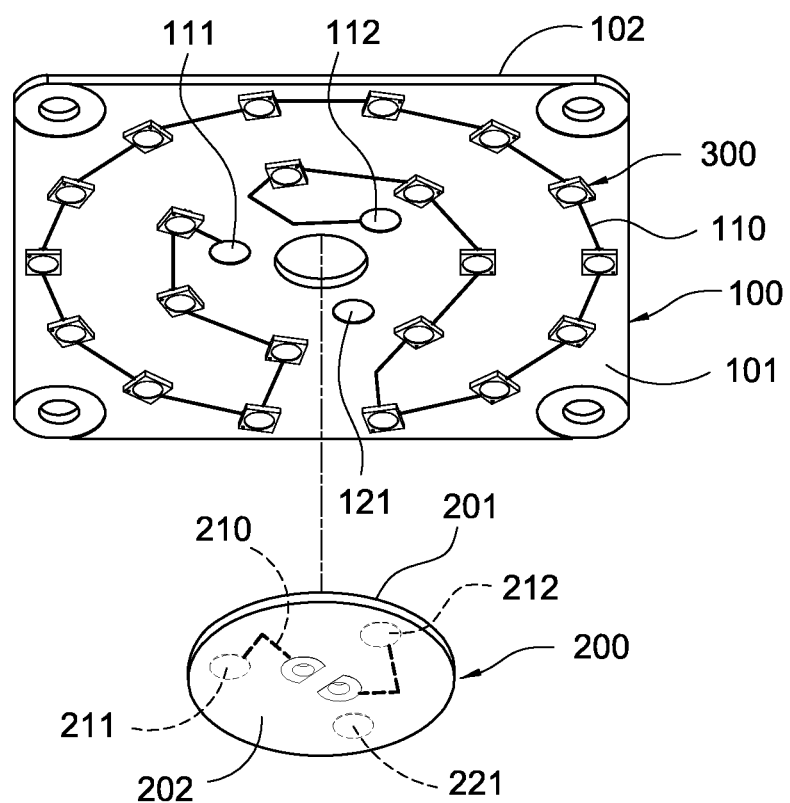
FIG. 1 is an exploded view of a light emitting diode module in accordance with a first preferred embodiment of the present invention.
Figure 2:
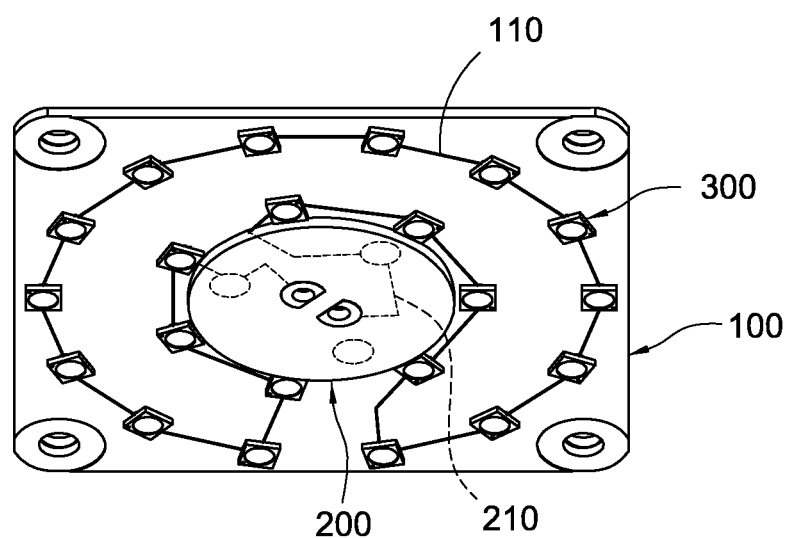
FIG. 2 is a perspective view of a light emitting diode module in accordance with the first preferred embodiment of the present invention.

With reference to FIGS. 1 and 2 for a light emitting diode module in accordance with the first preferred embodiment of the present invention, the light emitting diode module comprises a metal substrate 100, a main circuit 110, an adapter circuit board 200 and an adapter circuit 210.

The metal substrate 100 is a flat plate preferably made of aluminum, but the present invention is not limited to aluminum only. For example, copper or any other equivalent metal can be used. The metal substrate 100 has two opposite surfaces respectively an illumination surface 101 and an installation surface 102.

The main circuit 110 is a printed circuit printed and formed on an illumination surface 101 of the metal substrate 100, and the main circuit 110 includes a plurality of first power points 111, 112. In this preferred embodiment, the main circuit 110 preferably includes two first power points 111, 112 for supplying power to positive and negative electrodes.

In this preferred embodiment, the adapter circuit board 200 is preferably made of an insulating material such as a fiberglass material with the FR4 specification, but the present invention is not limited to the insulating material only, and the two opposite surfaces include an adapter surface 201 and a backside 202.

The adapter circuit 210 is a printed circuit printed and formed on the adapter surface 201 of the adapter circuit board 200, and the adapter circuit 210 includes a plurality of second power points 211, 212, and the quantity of the second power points 211, 212 is equal to the quantity of the first power points 111, 112, and each second power point 211, 212 corresponds to each of the respective first power points 111, 112. In this preferred embodiment, the second power points correspond to the two first power points 111, 112 respectively, and the adapter circuit 210 preferably includes two second power points 211, 212, and each second power point 211, 212 is preferably soldered and electrically coupled to each of the corresponding first power points 111, 112, so that the adapter circuit 210 is electrically coupled to the main circuit 110.

The plurality of light emitting diodes 300 is installed on the illumination surface 101 of the metal substrate 100 and electrically coupled to the main circuit 110.

The light emitting diode module in accordance of this preferred embodiment of the present invention further comprises a first fixed soldering point 121 and a second fixed soldering point 221 corresponding to the first fixed soldering point 121, and the first fixed soldering point 121 is a printed circuit printed and formed on the illumination surface 101 of the metal substrate 100 (wherein the first fixed soldering point 121 is preferably not electrically coupled to the main circuit 110, but the present invention is not limited to such arrangement only), and the second fixed soldering point 221 is printed and formed on the adapter surface 201 of the adapter circuit board 200 by the circuit printing method (wherein the second fixed soldering point 221 is preferably not electrically coupled to the adapter circuit 210, but the present invention is not limited to such arrangement only). The adapter circuit board 200 is fixed onto the metal substrate 100 by soldering the first power points 111, 112 with the second power points 211, 212, and soldering the first fixed soldering point 121 with the second fixed soldering point 221 to enhance the structural strength of the soldering. Preferably, the two first power points 111, 112 and the first fixed soldering point 121 are arranged at three vertices of a triangular shape (preferably a regular triangular shape), and the two second power points 211, 212 and the second fixed soldering point 221 are also arranged into a triangular shape to achieve a better structural strength.

In this preferred embodiment, the light emitting diode 300 and the adapter circuit board 200 are preferably installed on the metal substrate 100, and the adapter surface 201 of the adapter circuit board 200 is in contact with the illumination surface 101 of the metal substrate 100, and each first power point 111, 112 is aligned with each of the corresponding second power points 211, 212, and the first fixed soldering point 121 is aligned with the second fixed soldering point 221, and metal substrate 100 with the aforementioned components is placed into a soldering pot to solder the light emitting diode 300 and the adapter circuit board 200 onto the metal substrate 100 by a surface mount technology (SMT) process.

Figure 3:
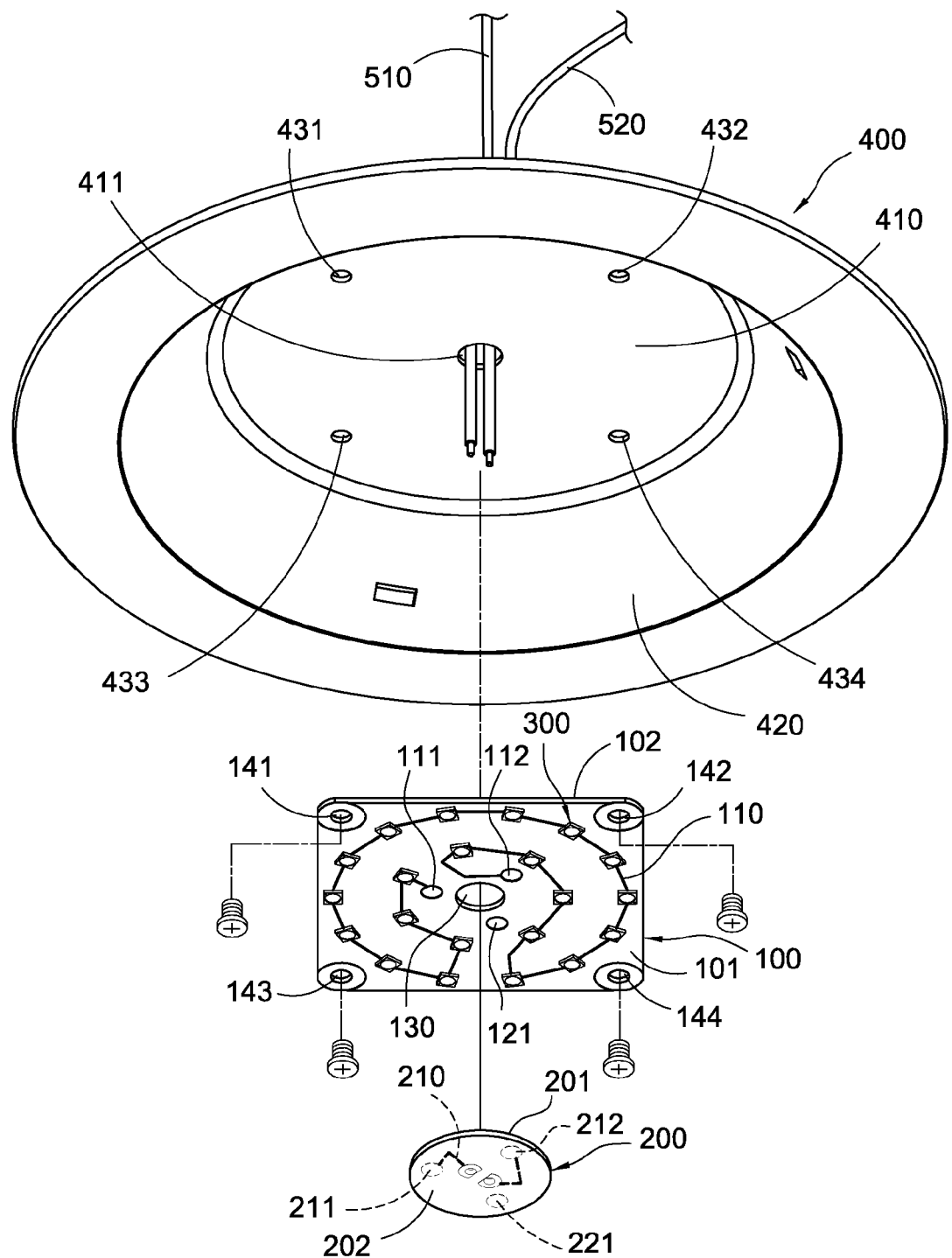
FIG. 3 is an exploded view of a light emitting diode module in accordance with a second preferred embodiment of the present invention.
Figure 4:
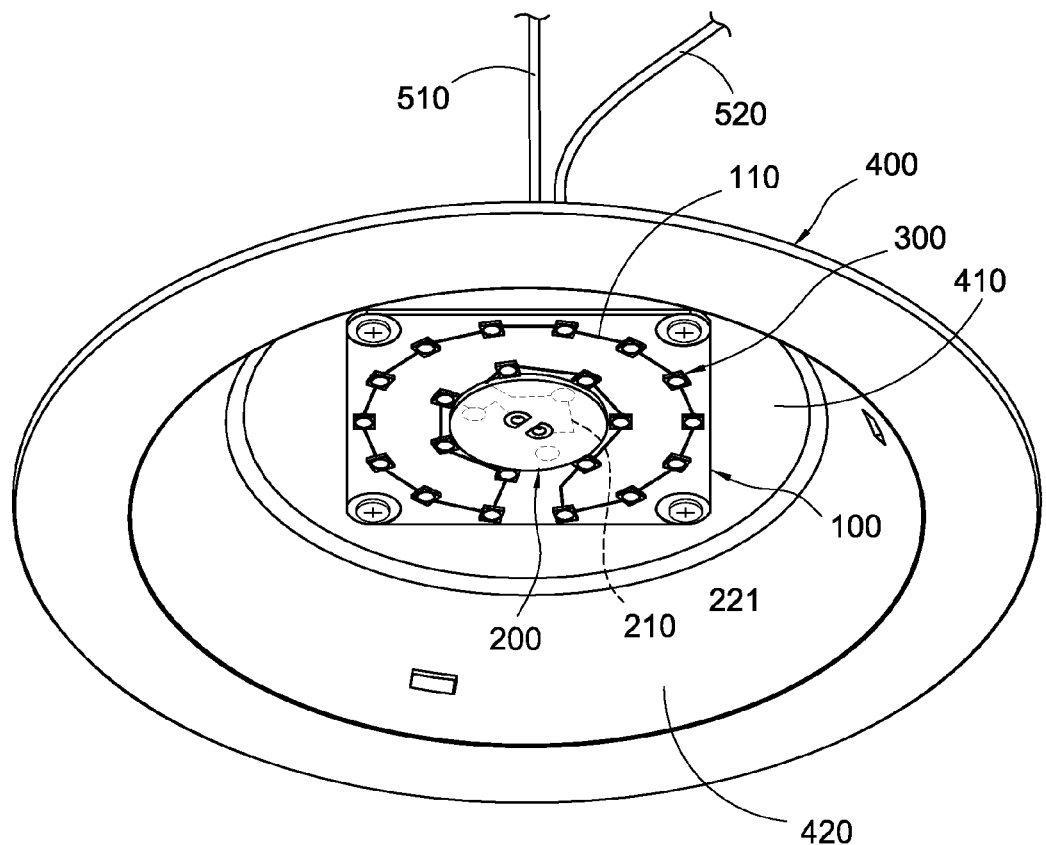
FIG. 4 is a perspective view of a light emitting diode module in accordance with the second preferred embodiment of the present invention.

With reference to FIGS. 3 and 4 for a light emitting diode lamp in accordance with the second preferred embodiment of the present invention, the light emitting diode lamp comprises a reflection cover 400, a light emitting diode module and a plurality of power lines 510, 520.

The reflection cover 400 is an open cover, and the reflection cover 400 of this preferred embodiment preferably comprises a bottom plate 410 and a sidewall 420, and the bottom plate 410 is a flat plate having a wire hole 411 formed on and penetrated through the bottom plate 410, and the sidewall 420 is enclosed to form a cylindrical form, wherein an end opening and the other end of the sidewall 420 are coupled to the bottom plate 410 and sealed. However, the open cover of the reflection cover 400 is not limited to the aforementioned arrangement only. For example, the reflection cover 400 can be an open cover with a hemispherical housing and having a wire hole 411 formed on and penetrated through the reflection cover 400.

The light emitting diode module is installed on an inner side of the reflection cover 400, and the reflection cover 400 is provided for collecting the light emitted from the light emitting diode module, and the light emitting diode module comprises a metal substrate 100, a main circuit 110, an adapter circuit board 200, an adapter circuit 210 and a plurality of light emitting diodes 300.

The metal substrate 100 and the main circuit 110 are the same as those of the first preferred embodiment, but the metal substrate 100 of this preferred embodiment further comprises a soldering opening 130 penetrated through the metal substrate 100, and the soldering opening 130 is preferably disposed at the center of the metal substrate 100.

The adapter circuit board 200 of this preferred embodiment is the same as that of the first preferred embodiment, but the adapter circuit board 200 of this preferred embodiment preferably comprises two penetrating holes 231, 232 penetrated through the adapter circuit board 200, and the two penetrating holes 231, 232 are disposed closely adjacent to each other. Preferably, the backside 202 has a white light reflecting layer (such as a plated or coated white light reflecting layer) formed thereon to facilitate reflecting the light source emitted from the light emitting diode 300.

Figure 5:
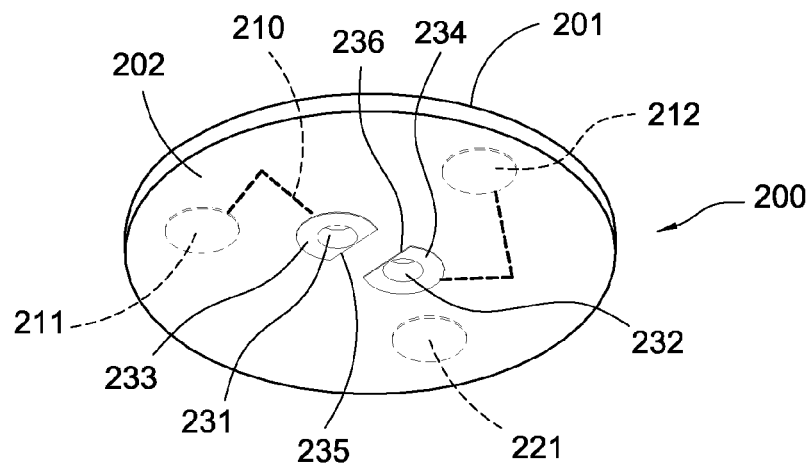
FIG. 5 is a schematic view of an adapter circuit board in a light emitting diode module in accordance with the second preferred embodiment of the present invention.

With reference to FIG. 5, the printed circuit of the adapter circuit 210 is formed and printed onto the adapter surface 201 of the adapter circuit board 200, and a circular adapter electrode 233, 234 is formed at the periphery of each penetrating hole 231, 232 by a circuit printing method, and the adapter electrode 233, 234 is disposed on the backside 202 of the adapter circuit board 200 and electrically coupled to the adapter circuit 210. Since the two penetrating holes 231, 232 are disposed closely adjacent to each other, and each of the adapter electrodes 233, 234 includes a cut angle 235, 236 formed between the two adapter electrodes 233, 234 to enhance the distance between the two adapter electrodes 233, 234 to prevent short circuits between the two adapter electrodes 233, 234. The adapter circuit 210 comprises a plurality of second power points 211, 212 with the same quantity as the first power points 111, 112, and each second power point 211, 212 corresponds to one of the corresponding first power points 111, 112 which corresponds to the two first power points 111, 112 in this preferred embodiment, and the adapter circuit 210 preferably comprises two second power points 211, 212, and each second power point 211, 212 is preferably attached and electrically coupled to one of the corresponding first power points 111, 112 by a soldering method, such that the adapter circuit 210 is electrically coupled to the main circuit 110.

With reference to FIGS. 3 and 4, the plurality of light emitting diodes 300 is installed on the illumination surface 101 of the metal substrate 100 and electrically coupled to the main circuit 110. The light emitting diodes 300 are preferably distributed uniformly and outwardly from the center of the soldering opening 130 to form a circular shape, so that the light emitted from the light emitting diode 300 can be scattered uniformly.

With reference to FIGS. 3 and 5 in this preferred embodiment, the light emitting diode module of the present invention further comprises a first fixed soldering point 121 and a second fixed soldering point 221 corresponding to the first fixed soldering point 12, similarly to the first preferred embodiment. The two penetrating holes 231, 232 are disposed within a range of the triangular shape enclosed by the two second power points 211, 212 and the second fixed soldering point 221 so as to minimize the distance between each adapter electrode 233, 234 and each corresponding second power point 211, 212.

In this preferred embodiment, the light emitting diode 300 and the adapter circuit board 200 are preferably soldered onto the metal substrate 100 by the SMT process, similarly to the first preferred embodiment.

Figure 6:
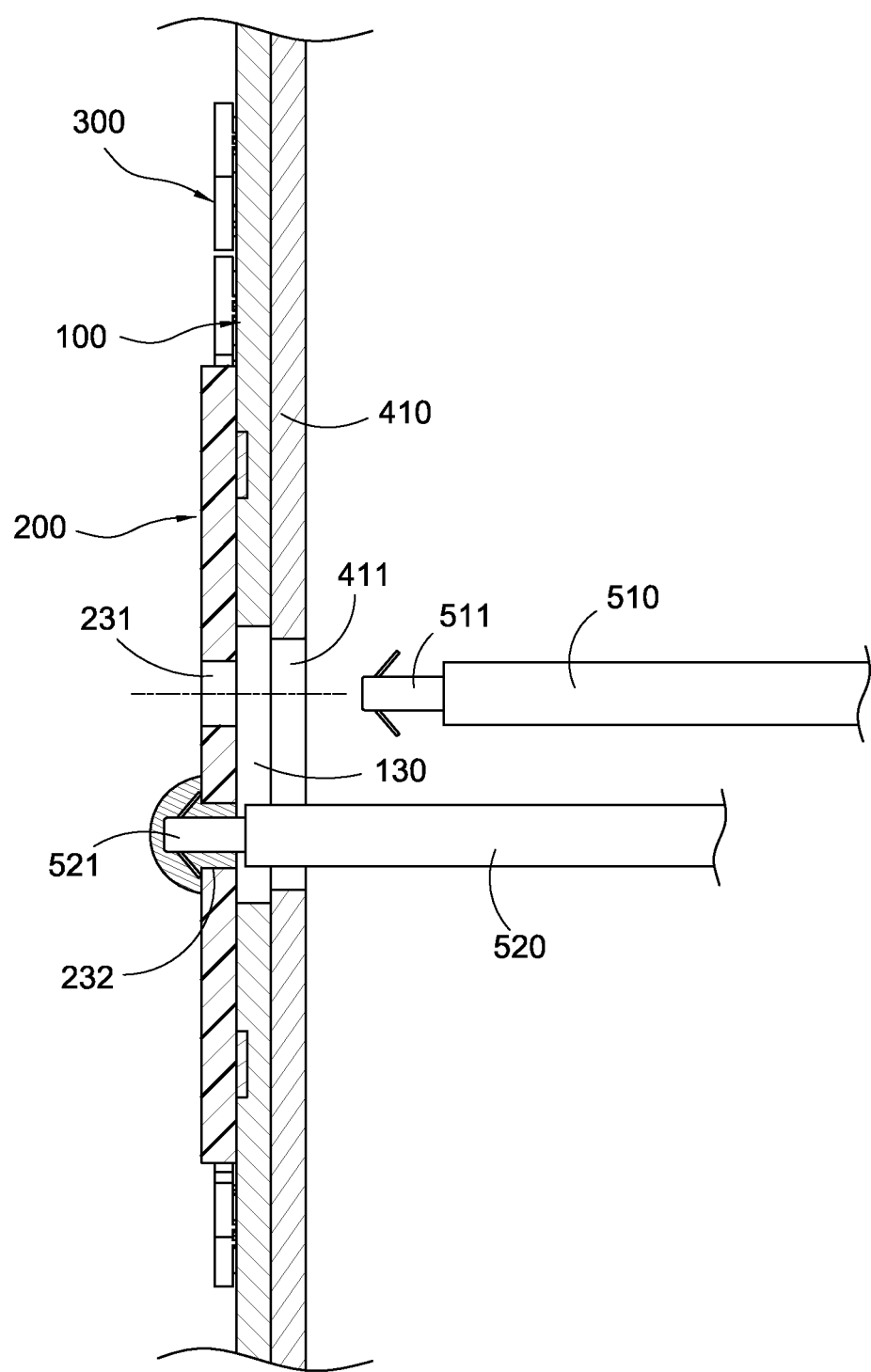
FIG. 6 is a cross-sectional view of a light emitting diode module in accordance with the second preferred embodiment of the present invention.

With reference to FIGS. 3 and 6, this preferred embodiment preferably comprises two power lines 510, 520, and each power line 510, 520 has a wire diameter below the size number of 20AWG (the greater the size number, the greater is the wire diameter) to assure that the power lines 510, 520 can bear the rated power of the light emitting diode lamp of the present invention. An inverted-hook connector 511, 521 is installed at an end of each power line 510, 520 corresponding to the two penetrating holes 231, 232 of the adapter circuit board 200 and provided for passing the power line 510, 520 from an outer side of the reflection cover 400 through the wire hole 411 and the soldering opening 130 into the corresponding penetrating holes 231, 232 and the power line 510, 520 is in contact with the adapter electrode 233, 234, and each inverted-hook connector 511, 521 is soldered to the corresponding adapter electrode 233, 234, such that each power line 510, 520 is fixed into the corresponding penetrating hole 231, 232 and electrically coupled to the adapter circuit 210, and the other end of each power line 510, 520 is coupled to a power supply, and power is passed through the power lines 510, 520, the adapter circuit 210, and the main circuit 110 and supplied to the light emitting diode 300.

In this preferred embodiment, the metal substrate 100 preferably includes but not limited to four first locking holes 141, 142, 143, 144, and the four first locking holes 141, 142, 143, 144 include four second locking holes 431, 432, 433, 434 formed on and penetrated through the bottom plate 410. The metal substrate 100 is disposed on an inner side of the reflection cover 400 and the installation surface 102 is in contact with the bottom plate 410 of the reflection cover 400, and a screw is passed through each of the corresponding first locking holes 141, 142, 143, 144 and secured into each of the corresponding second locking holes 431, 432, 433, 434 to secure the metal substrate 100 onto an inner light collecting side. The metal substrate 100 is preferably installed on the inner light collecting side, but the invention is not limited to such arrangement only.

Compared with the prior art, the light emitting diode module and lamp of the present invention replace the connector by the adapter circuit board 200, so that the power lines 510, 520 can be conducted and supply power to the light emitting diodes 300 on the metal substrate. The adapter circuit board 200 incurs a material cost for components and a lower manufacturing cost for the soldering process, and the adapter circuit board 200 has a thickness substantially equal to or smaller than the thickness of the light emitting diode 300, so that no shadow will be formed in the light source projected by the light emitting diodes 300.

While the invention has been described by means of specific embodiments, numerous modifications and variations could be made thereto by those skilled in the art without departing from the scope and spirit of the invention set forth in the claims.

What is claimed is:

1. A light emitting diode module, comprising:
   a metal substrate;
   a main circuit, installed on a surface of the metal substrate, and including a plurality of first power points;
   an adapter circuit board, including an adapter surface and a backside opposite to the adapter surface;
   an adapter circuit, installed on the adapter surface of the adapter circuit board, and including a plurality of second power points with the same quantity of the first power points, and each second power point being attached and electrically coupled to one of the corresponding first power points; and
   a plurality of light emitting diodes, installed on the surface of the metal substrate and electrically coupled to the main circuit.

2. The light emitting diode module of claim 1, further comprising a first fixed soldering point disposed on the surface of the metal substrate and a second fixed soldering point disposed on the surface of the adapter circuit board and corresponding to the first fixed soldering point, and the first fixed soldering point and the second fixed soldering point being soldered and fixed.

3. The light emitting diode module of claim 2, wherein the light emitting diode module comprises two first power points, and the first power points and the first fixed soldering point are arranged into a triangular shape.

4. A light emitting diode lamp, comprising:

a reflection cover, including a wire hole;

a light emitting diode module, installed on an inner side of the reflection cover, and including a metal substrate, a main circuit, an adapter circuit board and a plurality of light emitting diodes, and the metal substrate including a soldering opening, and the main circuit being installed on the surface of the metal substrate and including a plurality of first power points, and the adapter circuit board including an adapter surface and a backside opposite to the adapter surface, and the adapter circuit being installed on the adapter surface of the adapter circuit board, and the adapter circuit including a plurality of second power points with the same quantity of the first power points, and each second power point being electrically coupled to one of the corresponding first power points, and the light emitting diodes being installed on the surface of the metal substrate and electrically coupled to the main circuit; and a plurality of power lines, passing from an outer side of the reflection cover through the wire hole and the soldering opening to electrically couple the adapter circuit.

5. The light emitting diode lamp of claim 4, further comprising a first fixed soldering point disposed on the surface of the metal substrate and a second fixed soldering point disposed on the surface of the adapter circuit board and corresponding to the first fixed soldering point, and the first fixed soldering point and the second fixed soldering point being soldered and fixed.

6. The light emitting diode module of claim 5, wherein the light emitting diode module includes two of the first power points, and the two first power points and the first fixed soldering point are arranged into a triangular shape.

7. The light emitting diode lamp of claim 4, wherein the adapter circuit board includes a plurality of penetrating holes corresponding to the power lines respectively, and an adapter electrode is formed at an external periphery of each of the penetrating holes, disposed on the backside, and electrically coupled to the adapter circuit, and each of the power lines passes into the penetrating hole and is soldered to each of the corresponding adapter electrodes and electrically coupled to the adapter circuit.

8. The light emitting diode lamp of claim 7, wherein each power line includes an inverted-hook connector passing into the corresponding penetrating hole to fix the power line at the penetrating hole and keep the inverted-hook in contact with the adapter electrode.

9. The light emitting diode lamp of claim 4, wherein the backside includes a light reflecting layer disposed thereon, and the light reflecting layer is in a white color.

10. The light emitting diode lamp of claim 4, wherein the soldering opening is disposed at the center of the metal substrate.

* * * * *